(12) United States Patent
Christian et al.

(10) Patent No.: US 6,630,360 B2
(45) Date of Patent: Oct. 7, 2003

(54) ADVANCED PROCESS CONTROL (APC) OF COPPER THICKNESS FOR CHEMICAL MECHANICAL PLANARIZATION (CMP) OPTIMIZATION

(75) Inventors: Craig William Christian, Buda, TX (US); James Clayton Stice, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/044,641

(22) Filed: Jan. 10, 2002

(65) Prior Publication Data

US 2003/0129774 A1 Jul. 10, 2003

(51) Int. Cl.$^7$ ............................................. H01L 21/00
(52) U.S. Cl. ............................. 438/5; 438/8; 438/687; 205/82; 205/84
(58) Field of Search ............................. 438/5, 8, 687; 205/82, 84

(56) References Cited

U.S. PATENT DOCUMENTS

| | | | |
|---|---|---|---|
| 4,648,944 A | 3/1987 | George et al. | 204/1 |
| 4,902,398 A | 2/1990 | Homstad | 204/298 |
| 4,949,671 A | 8/1990 | Davis et al. | 118/725 |
| 4,988,533 A | 1/1991 | Freeman et al. | 427/38 |
| 5,135,636 A | 8/1992 | Yee et al. | 205/96 |
| 5,138,973 A | 8/1992 | Davis et al. | 118/723 |
| 5,605,615 A * | 2/1997 | Goolsby et al. | 204/229.2 |
| 5,684,713 A | 11/1997 | Asada et al. | 364/512 |
| 5,754,842 A | 5/1998 | Minagawa | 395/604 |
| 5,989,397 A | 11/1999 | Laube et al. | 204/298.03 |
| 5,999,886 A | 12/1999 | Martin et al. | 702/31 |
| 6,028,986 A | 2/2000 | Song | 395/500.02 |
| 6,074,544 A * | 6/2000 | Reid et al. | 205/105 |
| 6,151,532 A | 11/2000 | Barone et al. | 700/121 |
| 6,162,488 A | 12/2000 | Gevelber et al. | 427/8 |
| 6,174,425 B1 | 1/2001 | Simpson et al. | 205/96 |
| 6,199,301 B1 | 3/2001 | Wallace | 34/623 |
| 6,200,450 B1 * | 3/2001 | Hui | 204/224 R |
| 6,231,743 B1 | 5/2001 | Etherington | 205/83 |
| 6,297,155 B1 * | 10/2001 | Simpson et al. | 438/14 |
| 6,428,673 B1 * | 8/2002 | Ritzdorf et al. | 204/228.7 |

FOREIGN PATENT DOCUMENTS

| | | |
|---|---|---|
| WO | 01/91163 A3 | 11/2001 |
| WO | 01/91163 A2 | 11/2001 |

OTHER PUBLICATIONS

International PCT Search Report dated Dec. 20, 2002.

* cited by examiner

*Primary Examiner*—John F. Niebling
*Assistant Examiner*—Angel Roman
(74) *Attorney, Agent, or Firm*—Williams, Morgan & Amerson

(57) ABSTRACT

A method is provided that comprises forming a copper seed layer on a workpiece and measuring the uniformity of the copper seed layer on the workpiece. The method further comprises applying the uniformity measurement to modify processing to form a copper layer having a desired uniformity profile for increased planarization in subsequent planarizing.

20 Claims, 9 Drawing Sheets

ADVANCED PROCESS CONTROL (APC) OF COPPER THICKNESS FOR CHEMICAL MECHANICAL PLANARIZATION (CMP) OPTIMIZATION

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are process parameters related to chemical mechanical planarization (CMP). Examples of such process parameters include the deposition pattern and/or profile, whether center thick or center thin, and/or the magnitude of the "delta thickness," which measures the difference between the thickness of a process layer at the center of the workpiece and the thickness of a process layer at the edge of the workpiece. For example, if the polishing profile is edge-fast, then more material needs to be at the edge of the workpiece than at the center. Otherwise, the edge of the workpiece may be overpolished in an edge-fast polishing process, requiring costly and expensive reworking of the workpiece through the polishing processing. This may cause differences in wafer processing between successive runs or batches or lots of wafers, leading to decreased satisfactory wafer throughput, decreased reliability, decreased precision and decreased accuracy in the semiconductor manufacturing process.

However, traditional statistical process control (SPC) techniques are often inadequate to control precisely process parameters related to chemical mechanical planarization (CMP) in semiconductor and microelectronic device manufacturing so as to optimize device performance and yield. Typically, statistical process control (SPC) techniques set a target value, and a spread about the target value, for the process parameters related to chemical mechanical planarization (CMP). The statistical process control (SPC) techniques then attempt to minimize the deviation from the target value without automatically adjusting and adapting the respective target values to optimize the semiconductor device performance, and/or to optimize the semiconductor device yield and throughput. Furthermore, blindly minimizing non-adaptive processing spreads about target values may not increase processing yield and throughput.

The present invention is directed to overcoming, or at least reducing the effects of, one or more of the problems set forth above.

SUMMARY OF THE INVENTION

In one aspect of the present invention, a method is provided that comprises forming a copper seed layer on a workpiece and measuring the uniformity of the copper seed layer on the workpiece. The method also comprises applying the uniformity measurement to modify processing to form a copper layer having a desired uniformity profile for increased planarization in subsequent planarizing.

In another aspect of the present invention, a computer-readable, program storage device is provided, encoded with instructions that, when executed by a computer, perform a method that comprises forming a copper seed layer on a workpiece and measuring the uniformity of the copper seed layer on the workpiece. The method also comprises applying the uniformity measurement to modify processing to form a copper layer having a desired uniformity profile for increased planarization in subsequent planarizing.

In yet another aspect of the present invention, a computer programmed to perform a method is provided, the method comprising forming a copper seed layer on a workpiece and measuring the uniformity of the copper seed layer on the workpiece. The method also comprises applying the uniformity measurement to modify processing to form a copper layer having a desired uniformity profile for increased planarization in subsequent planarizing.

In another aspect of the present invention, a system is provided that comprises a tool for forming a copper seed layer on a workpiece and a tool for measuring the uniformity of the copper seed layer on the workpiece. The system also comprises a controller for applying the uniformity measurement to modify processing to form a copper layer having a desired uniformity profile for increased planarization in subsequent planarizing.

In yet another aspect of the present invention, a device is provided that comprises means for forming a copper seed layer on a workpiece and means for measuring the uniformity of the copper seed layer on the workpiece. The device also comprises means for applying the uniformity measurement to modify processing to form a copper layer having a desired uniformity profile for increased planarization in subsequent planarizing.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1, 2 and 8–11 schematically illustrate a flow chart for various illustrative embodiments of a method according to the present invention;

FIGS. 3–7 schematically illustrate a copper seed layer uniformity determination and subsequent processing to form an overlying copper layer;

FIG. 12 schematically illustrates a method for fabricating a semiconductor device practiced in accordance with the present invention; and FIG. 13 schematically illustrates workpieces being processed using a processing tool, using a plurality of control input signals, in accordance with the present invention.

Figure 1:
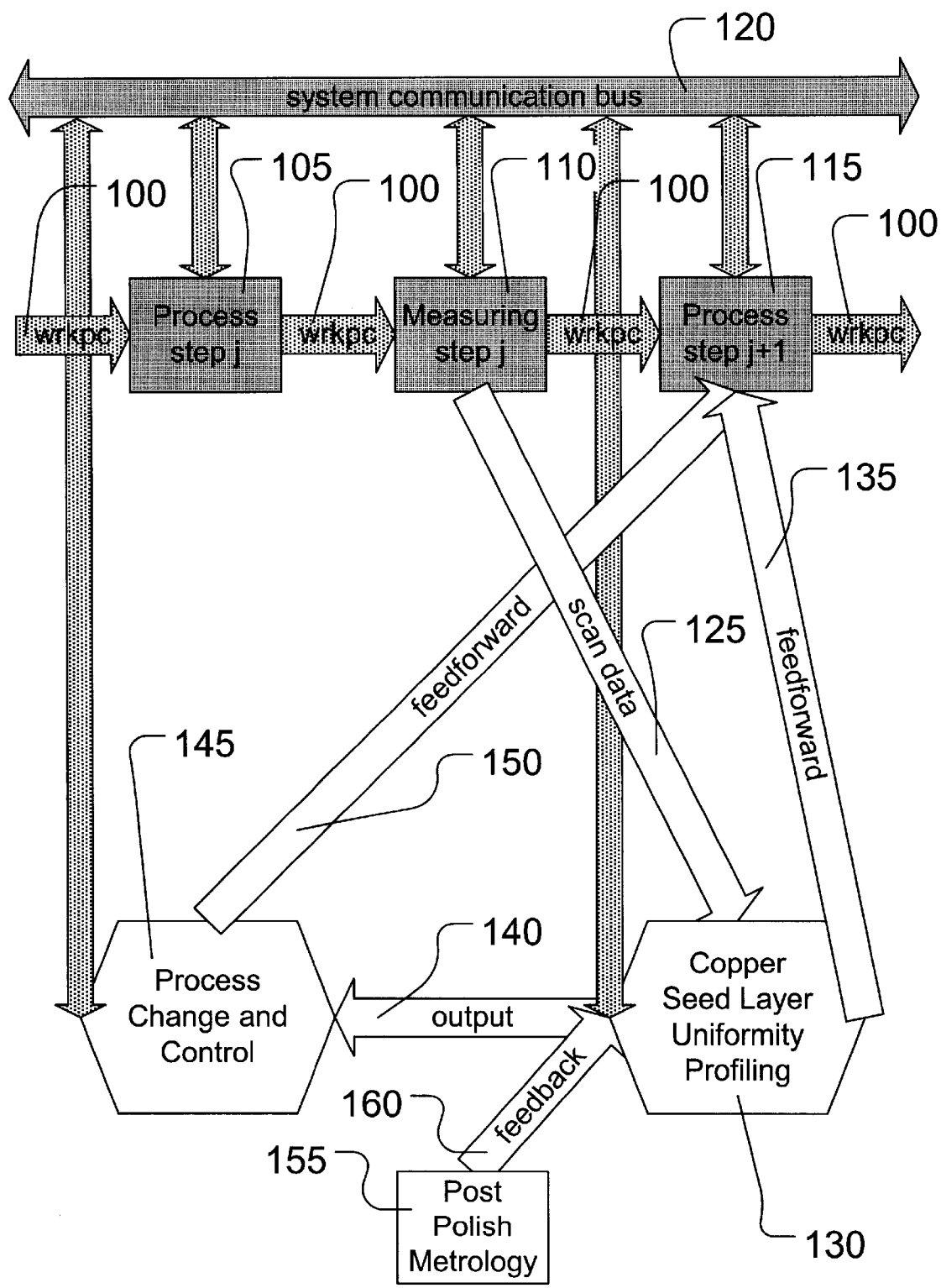
FIGS. 1–13 schematically illustrate various embodiments of a method of manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–13. As shown in FIG. 1, a workpiece 100, such as a semiconducting substrate or wafer, having zero, one or more process layers and/or semiconductor devices such as a metal-oxide semiconductor field effect transistor (MOSFET or MOS transistor) disposed thereon, for example, is delivered to a processing step j 105, where j may have any value from j=1 to j=N. The total number N of processing steps, such as masking, etching, depositing material and the like, used to form the finished workpiece 100, may range from N=1 to about any finite value.

Figure 3:
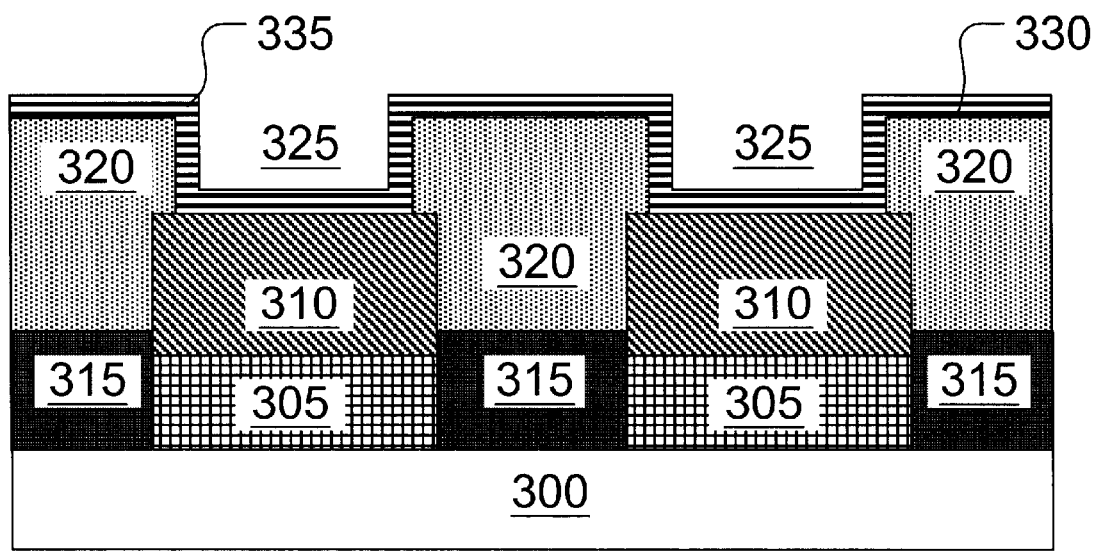

In various illustrative embodiments, the processing step j 105 may involve formation of a copper seed layer 335, as shown in FIG. 3. As shown in FIG. 1, a system communication bus 120 may be provided to facilitate communication between the processing step j 105, a measuring step j 110, and a further processing step j+1 115 for further processing, where j may have any value from j=1 to j=N, for a sequence of N total processing steps (when j=N, there will, of course, not be any further processing step j+1 115). Using the system communication bus 120, data and/or instructions may be exchanged between any or all of the various N processing and/or N measuring steps. In particular, using the system communication bus 120, scan data 125 from any measuring step j 110, where j may have any value from j=1 to j N, may be exchanged between, and made available to, any or all of the various N processing and/or N measuring steps, which may, in turn, pass the scan data 125 on to a copper seed layer uniformity profiling step 130. As shown in FIG. 1, the system communications bus 120 also provides communications between the processing step j 105, the measuring step j 110 and the further processing step j+1 115, and a copper seed layer uniformity profiling step 130 and a process change and control step 145, more fully described below.

Figure 2:
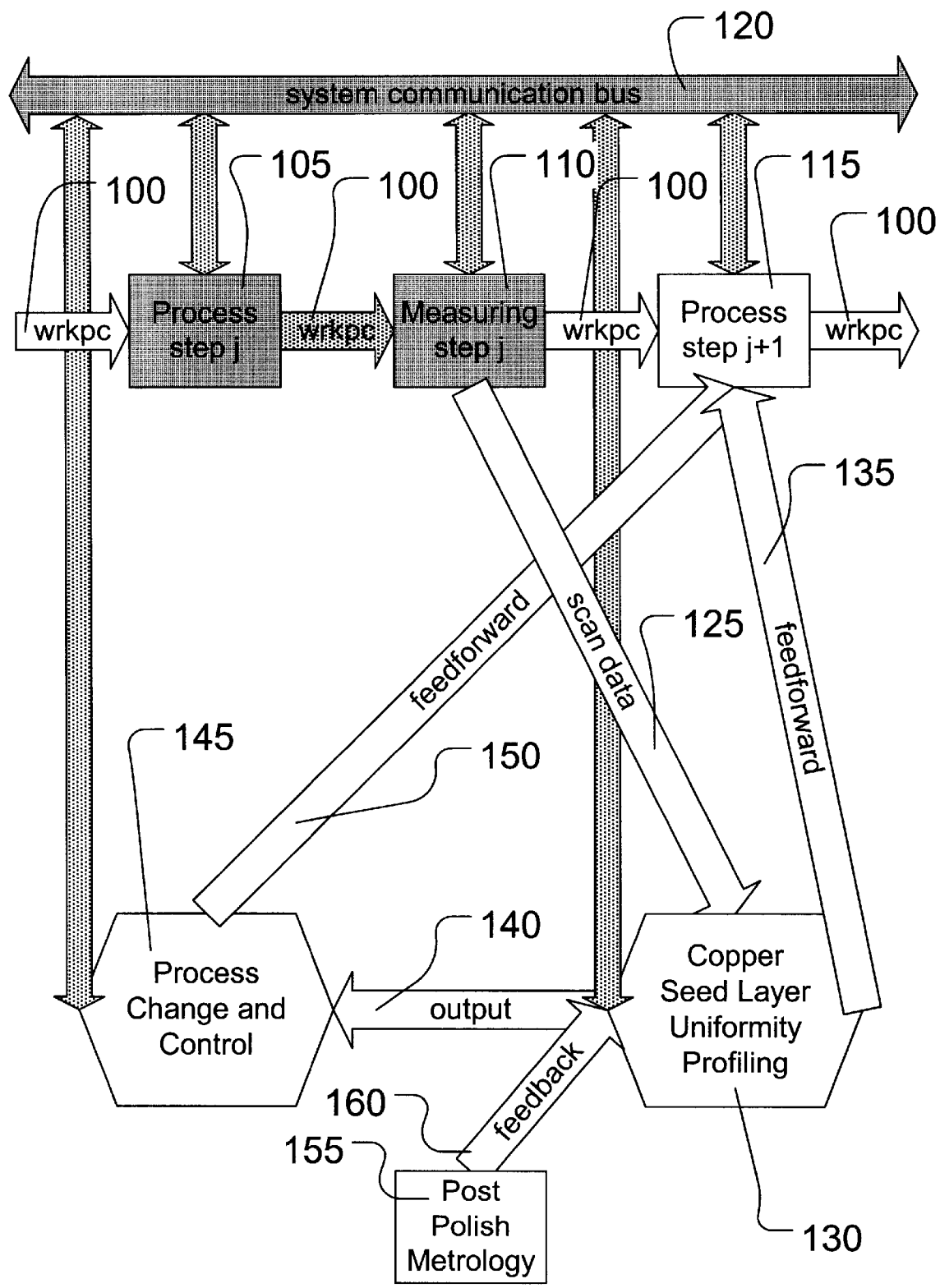

As shown in FIG. 2, the workpiece 100 is sent from the processing step j 105 and delivered to a measuring step j 110. In the measuring step j 110, the workpiece 100 is measured by having a metrology or measuring tool (not shown) measure one or more parameters characteristic of the processing performed in any of the previous processing steps (such as processing step j 105, where j may have any value from j=1 to j N). The measurements in the measuring step j 110 produce the scan data 125 indicative of the one or more characteristic parameters measured in the measuring step j 110. As shown in FIG. 2, if there is further processing to do on the workpiece 100 (if j<N), then the workpiece 100 may be sent from the measuring step j 110 and delivered to a processing step j+1 140 for further processing, and then sent on from the processing step j+1 140.

Figure 4:
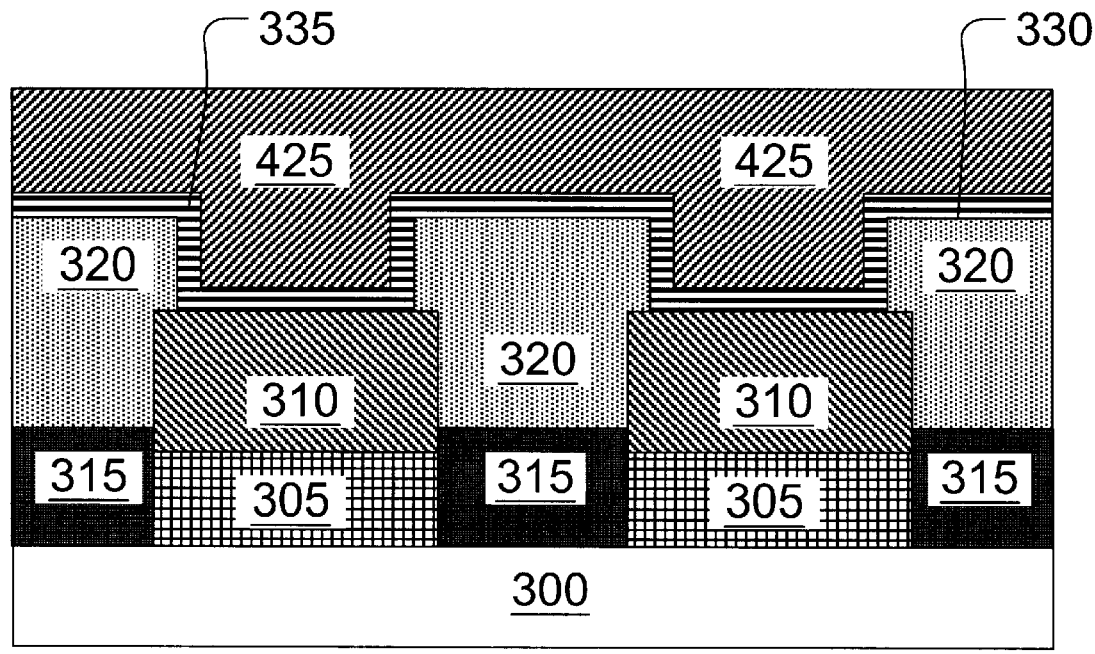
Figure 5:
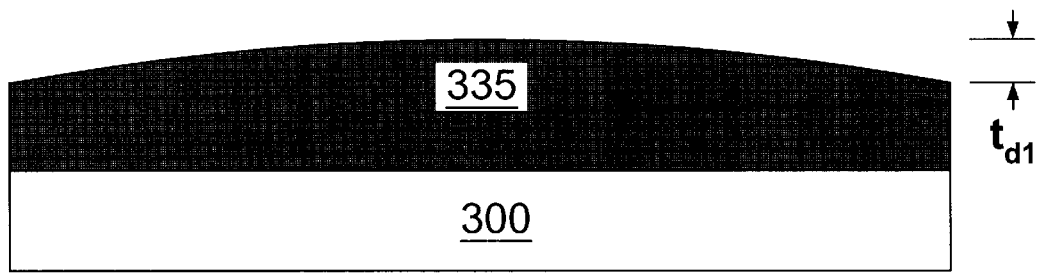
Figure 6:
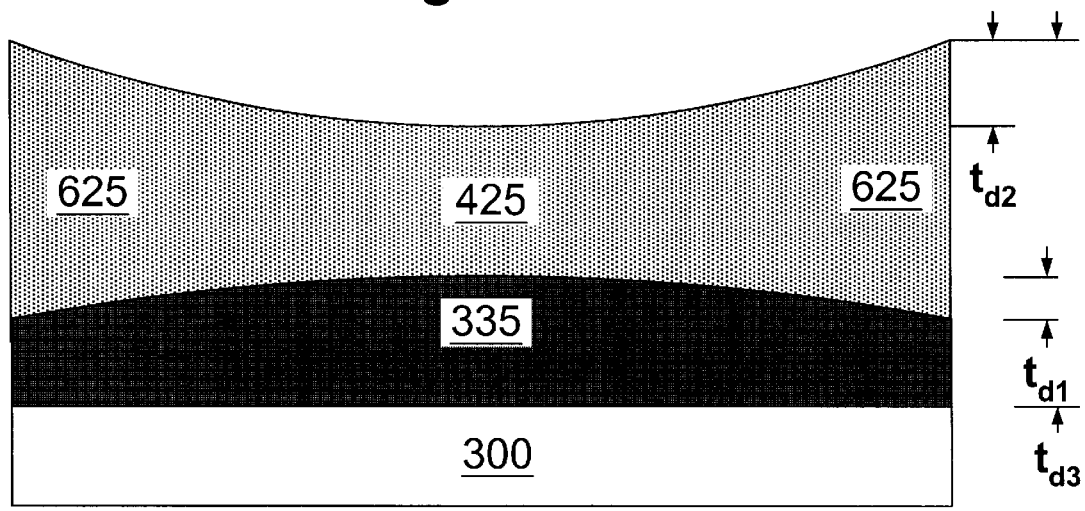
Figure 7:
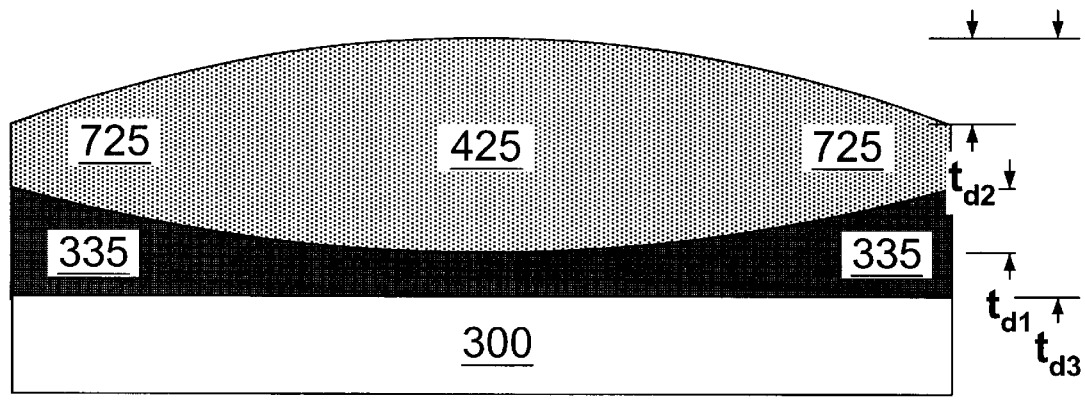

In various illustrative embodiments, there is further processing to do on the workpiece 100 (j<N) and the measuring step j 110 may be used to determine a workpiece 100 deposition pattern, for example, whether the copper seed layer 335 is center thick (as shown in FIGS. 5 and 6) or center thin (as shown in FIG. 7). The measuring step j 110 may also be used to determine a magnitude of delta thickness, as designated by $t_{d1}$, a difference between the thickness of the copper seed layer 335 in the center of the workpiece 100 and the thickness of the copper seed layer 335 at the edge of the workpiece 100. The uniformity of the copper seed layer 335 may be measured either on a workpiece-by-workpiece basis or on a lot-by-lot basis, using a multi-point contour map made using metrology products, such as the Rudolph Technologies, Inc. MetaPULSE™ 200 system and tool, or the Phillips Ruby system. FIGS. 3–7 schematically illustrate a copper seed layer 335 uniformity determination and subsequent processing to form an overlying copper layer 425.

As shown in FIG. 3, a dielectric gate layer 305 may be formed and patterned above a structure layer 300, such as a semiconducting substrate (e.g., a silicon wafer), having zero, one or more process layers and/or semiconductor devices such as a metal-oxide semiconductor field effect transistor (MOSFET or MOS transistor) disposed thereon, for example. The dielectric gate layer 305 may be formed by a variety of known techniques for forming such layers, e.g., thermal oxidation, chemical vapor deposition (CVD), low-pressure chemical vapor deposition (LPCVD), plasma-enhanced chemical vapor deposition (PECVD), sputtering or physical vapor deposition (PVD), and the like, and may have a thickness ranging from approximately 25–500 Å, for example.

The dielectric gate layer 305 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the dielectric gate layer 305 is comprised of a silicon dioxide ($SiO_2$) having a thickness of approximately 30 Å, which is formed by a thermal oxidation process.

As shown in FIG. 3, a plurality of structures 310, such as metal or polycrystalline silicon (polysilicon or poly) gates and/or interconnect lines 310, may be formed above the dielectric gate layer 305. The structures 310 may be formed by a variety of known techniques for forming such structures, e.g., chemical vapor deposition (CVD), low-pressure chemical vapor deposition (LPCVD), plasma-enhanced chemical vapor deposition (PECVD), sputtering or physical vapor deposition (PVD), high-density plasma (HDP) deposition, and the like, followed by patterning, using photolithography, reactive ion etching (RIE), and the like, and may have a thickness ranging from approximately 500–4500 Å. The structures 310 may be formed to have a critical dimension ranging from approximately 500–2500 Å. In one illustrative embodiment, the structures 310 comprise polysilicon and have a thickness of approximately 1000 Å, a critical dimension of approximately 750 Å, and are formed by a low-pressure chemical vapor deposition (LPCVD) process.

As shown in FIG. 3, a first dielectric layer 315 may be formed above the structure layer 300 and adjacent the dielectric gate layer 305 and the structures 310. The first dielectric layer 315 may at least partially and/or completely fill the gaps between adjacent structures 310. The first dielectric layer 315 may be formed by a variety of known techniques for forming such layers, e.g., chemical vapor deposition (CVD), low-pressure chemical vapor deposition (LPCVD), plasma-enhanced chemical vapor deposition (PECVD), sputtering or physical vapor deposition (PVD), high-density plasma (HDP) deposition, and the like, and may have a thickness ranging from approximately 300–6000 Å, for example. The first dielectric layer 315 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the first dielectric layer 315 is comprised of a silicon oxide ($Si_xO_y$) having a thickness of approximately 1500 Å, which is formed by a high-density plasma (HDP) deposition process.

As shown in FIG. 3, a second dielectric layer 320 may be formed above the first dielectric layer 315. The second dielectric layer 320 may be formed by a variety of known techniques for forming such layers, e.g., chemical vapor deposition (CVD), low-pressure chemical vapor deposition (LPCVD), plasma-enhanced chemical vapor deposition (PECVD), sputtering or physical vapor deposition (PVD), high-density plasma (HDP) deposition, and the like, and may have a thickness ranging from approximately 1500–9000 Å, for example.

The second dielectric layer 320 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the second dielectric layer 320 is comprised of tetraethyl orthosilicate (TEOS) having a thickness of approximately 6000 Å, which is formed by a plasma-enhanced chemical vapor deposition (PECVD) process.

In various illustrative alternative embodiments (not shown), there may only be one dielectric layer, either the first dielectric layer 315 or the second dielectric layer 320, but not both. In various other illustrative alternative embodiments (not shown), there may be more than one dielectric layer like the first dielectric layer 315 and/or like the second dielectric layer 320.

As shown in FIG. 3, in various illustrative embodiments of the present invention, the second dielectric layer 320 may be patterned to form openings 325. The removal, by reactive ion etching (RIE), for example, of portions of the second dielectric layer 320 may form openings 325. The openings 325 may be formed to have having a depth ranging from approximately 2000–4000 Å below the upper surface 330 of the second dielectric layer 320. The openings 325 may be formed to have a critical dimension ranging from approximately 500–5000 Å. The aspect ratio of the openings 325 may be defined to be the ratio of the depth to the critical dimension, ranging from approximately 1.5–7. In one illustrative embodiment, the openings 325 have a depth of approximately 2500 Å below the upper surface 330 of the second dielectric layer 320, a critical dimension of approximately 500 Å, an aspect ratio of approximately 5, and are formed by a reactive ion etching (RIE) process.

As shown in FIG. 3, one or more thin barrier metal layer(s) of tantalum (Ta), tantalum nitride (TaN) and a copper (Cu) seed layer 335 may be applied to the entire surface, using vapor-phase deposition, for example. The barrier metal layer(s) of tantalum (Ta), tantalum nitride (TaN) and a copper (Cu) seed layer 335 blanket-deposit an entire upper surface 330 of the second dielectric layer 320 and the openings 325.

The barrier metal layer(s) may be formed of at least one layer of a barrier metal material, such as tantalum or tantalum nitride, and the like. For example, the barrier metal layer(s) may also be formed of titanium nitride, titanium-tungsten, nitrided titanium-tungsten, or another suitable barrier material. The copper seed layer 335 may be formed on top of the one or more barrier metal layer(s) by physical vapor deposition (PVD) or chemical vapor deposition (CVD), for example.

The bulk of the copper trench-fill is frequently done using an electroplating technique, where the workpiece 100 is mechanically clamped to an electrode (not shown) to establish an electrical contact, and the structure layer 300 is then immersed in an electrolyte solution containing copper (Cu) ions. An electrical current is then passed through the wafer-electrolyte system to cause reduction and deposition of copper (Cu) on the copper seed layer 335. In addition, a pulse-reverse waveform or other types such as an alternating-current bias of the wafer-electrolyte system has been considered as a method of self-planarizing the deposited copper (Cu) film, similar to the deposit-etch cycling used in high-density plasma (HDP) tetraethyl orthosilicate (TEOS) or silane ($SiH_4$)-based dielectric depositions. Appropriate exemplary electroplating systems may be provided by the Novellus SABRE tools, the Applied Materials Electra tools, or the Semitool LT210C.

As shown in FIG. 4, this process typically produces a coating of copper (Cu) 425 across the entire workpiece 100. Once a sufficiently thick layer of copper (Cu) 425 has been deposited, the layer of copper (Cu) 425 may be planarized using chemical mechanical planarization or polishing (CMP) techniques. The copper fill should be optimized for planarization or polishing requirements. For example, if the chemical mechanical planarization or polishing (CMP) is edge-fast, more material should be on the edge of the workpiece 100 so that the workpiece 100 clears uniformly across the workpiece 100 at substantially the same time. This would reduce overpolishing of the workpiece 100 and also reduce the need for reworking the workpiece 100 through the chemical mechanical planarization or polishing (CMP). Similarly, if the chemical mechanical planarization or polishing (CMP) is center-fast, for example, more material should be at the center of the workpiece 100 so that the workpiece 100 clears uniformly across the workpiece 100 at substantially the same time. This would similarly reduce overpolishing of the workpiece 100 and also reduce the need for reworking the workpiece 100 through the chemical mechanical planarization or polishing (CMP).

As shown in FIG. 5, the barrier metal layer(s) of tantalum (Ta), tantalum nitride (TaN) and the copper (Cu) seed layer 335 may have a center thick profile, having a uniformity characterized by $t_{d1}$, the magnitude of delta thickness, as described above, a difference between the thickness of the copper seed layer 335 in the center of the workpiece 100 and the thickness of the copper seed layer 335 at the edge of the workpiece 100. The barrier metal layer(s) of tantalum (Ta), tantalum nitride (TaN) and the copper (Cu) seed layer 335 is not drawn to scale in FIG. 5, of course, but has been exaggerated for the sake of clarity.

As shown in FIG. 6, and as described more fully below, an Advanced Process Control (APC) system may calculate an electroplating deposition time and a uniformity required for the copper (Cu) layer 425, based on the uniformity measurement of the barrier metal layer(s) of tantalum (Ta), tantalum nitride (TaN) and the copper (Cu) seed layer 335, with input from polish uniformity. The output of the Advanced Process Control (APC) system may be used to vary and/or modify the recipe parameters to form the copper (Cu) layer 425. For example, the anode-cathode spacing, the anode power and/or anode current settings and/or anode waveform settings, the electroplating deposition time, and the like, may be varied and/or modified to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize the subsequent chemical mechanical planarization or polishing (CMP) techniques.

An exemplary information exchange and process control framework suitable for use in this manufacturing system is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications publicly available from SEMI.

As shown in FIG. 6, edge portions 625 may be formed as appropriate for edge-fast chemical mechanical planarization or polishing (CMP). As required, more material is on the edge of the workpiece 100 so that the workpiece 100 may clear uniformly across the workpiece 100 at substantially the same time. This reduces overpolishing of the workpiece 100 and also reduces the need for reworking the workpiece 100 through the chemical mechanical planarization or polishing (CMP).

The edge portions 625 may have a uniformity characterized by $t_{d2}$, the difference between the thickness of the copper (Cu) layer 425 in the center of the workpiece 100 and the thickness of the copper (Cu) layer 425 at the edge of the workpiece 100. The copper (Cu) layer 425 is not drawn to scale in FIG. 6, of course, but has been exaggerated for the sake of clarity.

In various alternative illustrative embodiments, as shown in FIG. 7, the barrier metal layer(s) of tantalum (Ta), tantalum nitride (TaN) and the copper (Cu) seed layer 335 may have a center thin profile, having a uniformity characterized by $t_{d1}$, the magnitude of delta thickness, as described above, a difference between the thickness of the copper seed layer 335 in the center of the workpiece 100 and the thickness of the copper seed layer 335 at the edge of the workpiece 100. As shown in FIG. 7, edge portions 725 may be formed as appropriate for center-fast chemical mechanical planarization or polishing (CMP). As required, less material is on the edge of the workpiece 100 so that the workpiece 100 may clear uniformly across the workpiece 100 at substantially the same time. This reduces overpolishing of the workpiece 100 and also reduces the need for reworking the workpiece 100 through the chemical mechanical planarization or polishing (CMP).

The edge portions 725 may have a uniformity characterized by $t_{d2}$, the difference between the thickness of the copper (Cu) layer 425 in the center of the workpiece 100 and the thickness of the copper (Cu) layer 425 at the edge of the workpiece 100. The copper (Cu) layer 425 and the barrier metal layer(s) of tantalum (Ta) and the copper (Cu) seed layer 335 are not drawn to scale in FIG. 7, of course, but have been exaggerated for the sake of clarity.

As shown in FIG. 7, and as described more fully below, an Advanced Process Control (APC) system may calculate an electroplating deposition time and a uniformity required for the copper (Cu) layer 425, based on the uniformity measurement of the barrier metal layer(s) of tantalum (Ta), tantalum nitride (TaN) and the copper (Cu) seed layer 335. The output of the Advanced Process Control (APC) system may be used to vary and/or modify the recipe parameters to form the copper (Cu) layer 425. For example, the anode-cathode spacing, the multiple anode power and/or current settings, the electroplating deposition time, and the like, may be varied and/or modified to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize the subsequent chemical mechanical planarization or polishing (CMP) techniques.

Figure 8:
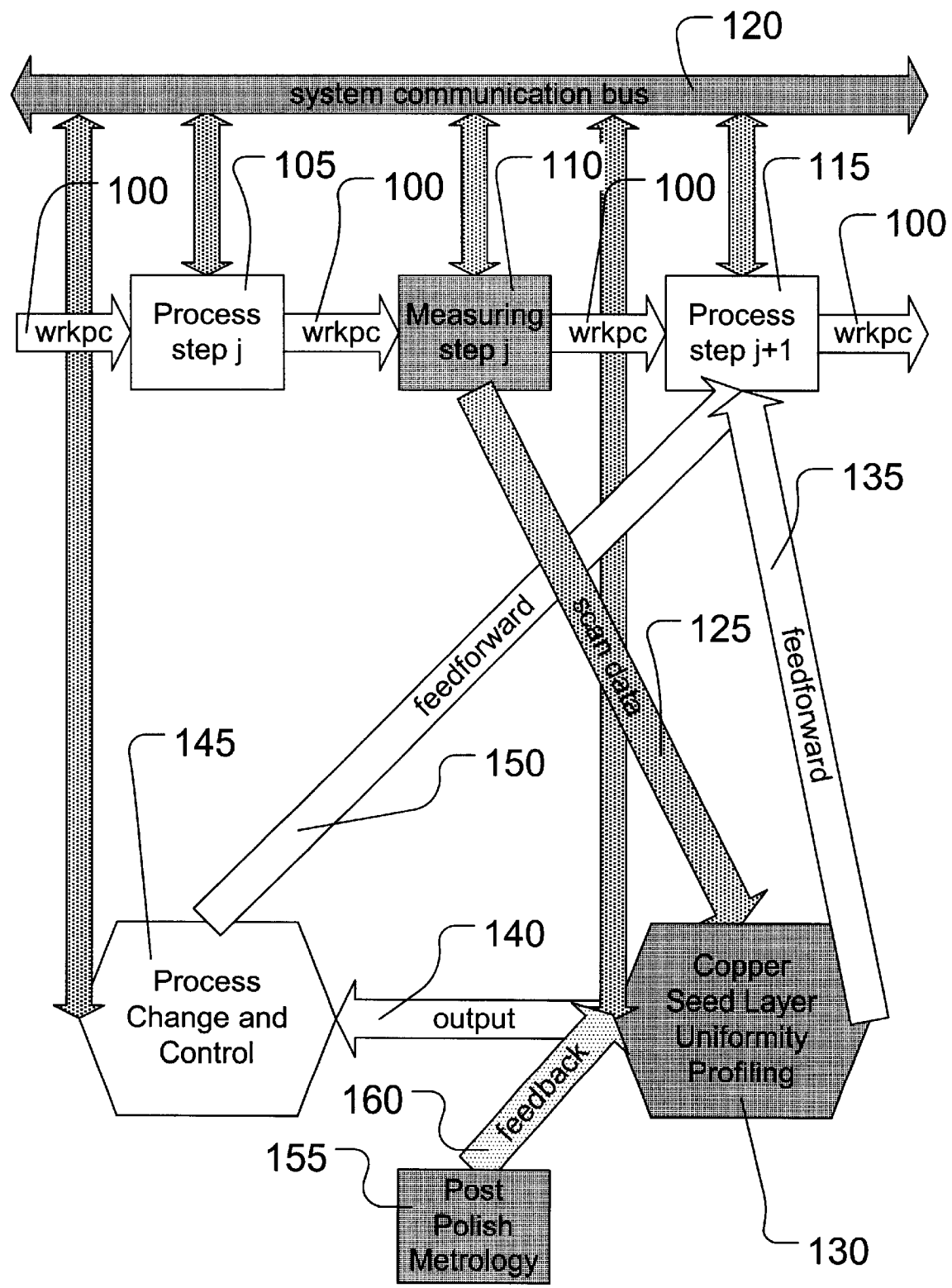

As shown in FIG. 8, the scan data 125 is sent from the measuring step j 110 and delivered to a copper seed layer uniformity profiling step 130. In the copper seed layer uniformity profiling step 130, the appropriate anode-cathode spacing and/or the anode power and/or current settings and/or the electroplating deposition time, and the like, may be calculated to give the variations and/or modifications needed to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize a subsequent chemical mechanical planarization or polishing (CMP) processing step, such as the further processing step j+1 115. Delivering the scan data 125 to the copper seed layer uniformity profiling step 130 produces an output signal 140. As shown in FIG. 8, using the system communication bus 120, scan data 125 from the measuring step j 110, where j may have any value from j=1 to j=N, may be exchanged between, and made available to, any or all of the various N processing and/or N measuring steps.

In various illustrative embodiments, a post-polish metrology step 155 may be used to determine the workpiece 100 deposition pattern, for example, whether the copper seed layer 335 is center thick (as shown in FIGS. 5 and 6) or center thin (as shown in FIG. 7). The post-polish metrology step 155 may also be used to determine the magnitude of delta thickness, as designated by $t_{d1}$, the difference between the thickness of the copper seed layer 335 in the center of the workpiece 100 and the thickness of the copper seed layer 335 at the edge of the workpiece 100. The uniformity of the copper seed layer 335 may be measured either on a workpiece-by-workpiece basis or on a lot-by-lot basis, using a multi-point contour map made using metrology products, such as the Rudolph Technologies, Inc. MetaPULSE™ 200 system and tool, or the Phillips Ruby system.

The post-polish metrology information measured in the post-polish metrology step 155 may be fed back, as indicated by feedback 160, to the copper seed layer uniformity profiling step 130. In the copper seed layer uniformity profiling step 130, the appropriate anode-cathode spacing and/or the anode power and/or current settings and/or the electroplating deposition time, and the like, may be calculated to give the variations and/or modifications needed to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize a subsequent chemical mechanical planarization or polishing (CMP) processing step, such as the further processing step j+1 115. Delivering the feedback 160 to the copper seed layer uniformity profiling step 130 may also produce the output signal 140. As shown in FIG. 8, using the system communication bus 120, feedback 160 from the post-polish metrology step 155 may be exchanged between, and made available to, any or all of the various N processing and/or N measuring steps.

The appropriate anode-cathode spacing and/or the anode power and/or current settings and/or the electroplating deposition time, and the like, determined in the copper seed layer uniformity profiling step 130, using the copper seed layer 335 uniformity measured in the measuring step j 110 and/or in the post-polish metrology step 155, may be used to alert an engineer of the need to adjust the processing performed in any of the previous and/or subsequent processing steps (such as processing step j 105, where j may have any value from j=1 to j=N). The engineer may then alter, for example, anode-cathode spacing and/or the anode power and/or current settings and/or the electroplating deposition time, and the like, affecting the output signal 140 produced.

Figure 9:
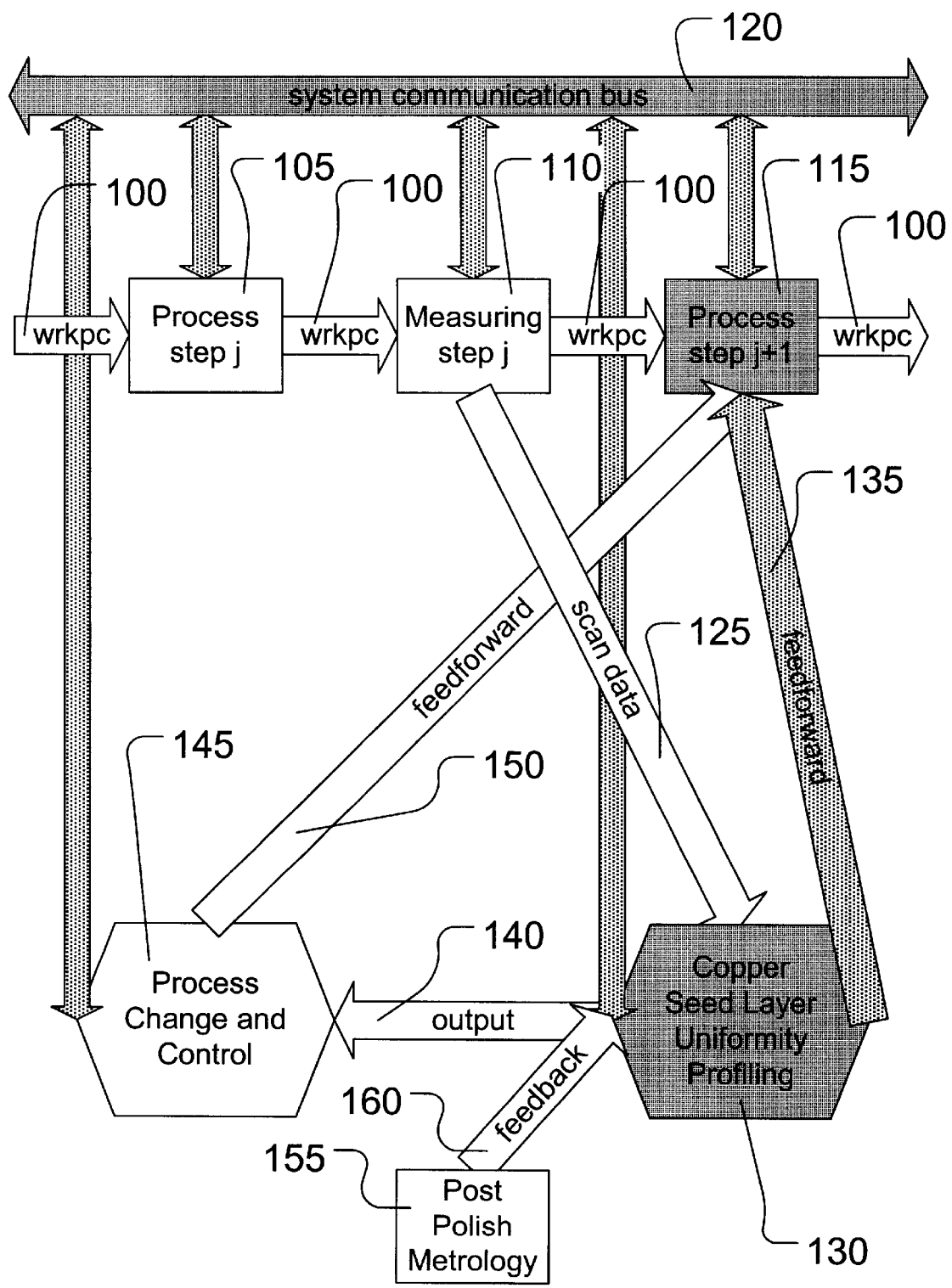

As shown in FIG. 9, a feedforward control signal 135 may be sent from the copper seed layer uniformity profiling step 130 to the processing step j+1 115 to adjust the processing performed in the processing step j+1 115. For example, the anode-cathode spacing, the anode power/current/waveform settings, the electroplating deposition time, and the like, may be varied and/or modified to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize the subsequent chemical mechanical planarization or polishing (CMP) techniques. In various alternative illustrative embodiments (not shown), the feedforward control signal 135 may be sent, using the system communication bus 120, for example, from the copper seed layer uniformity profiling step 130 to any of the previous and/or subsequent processing steps (similar to processing step j 105, where j may have any value from j=1 to j=N) to adjust the processing performed in any of the previous and/or subsequent processing steps.

Figure 10:
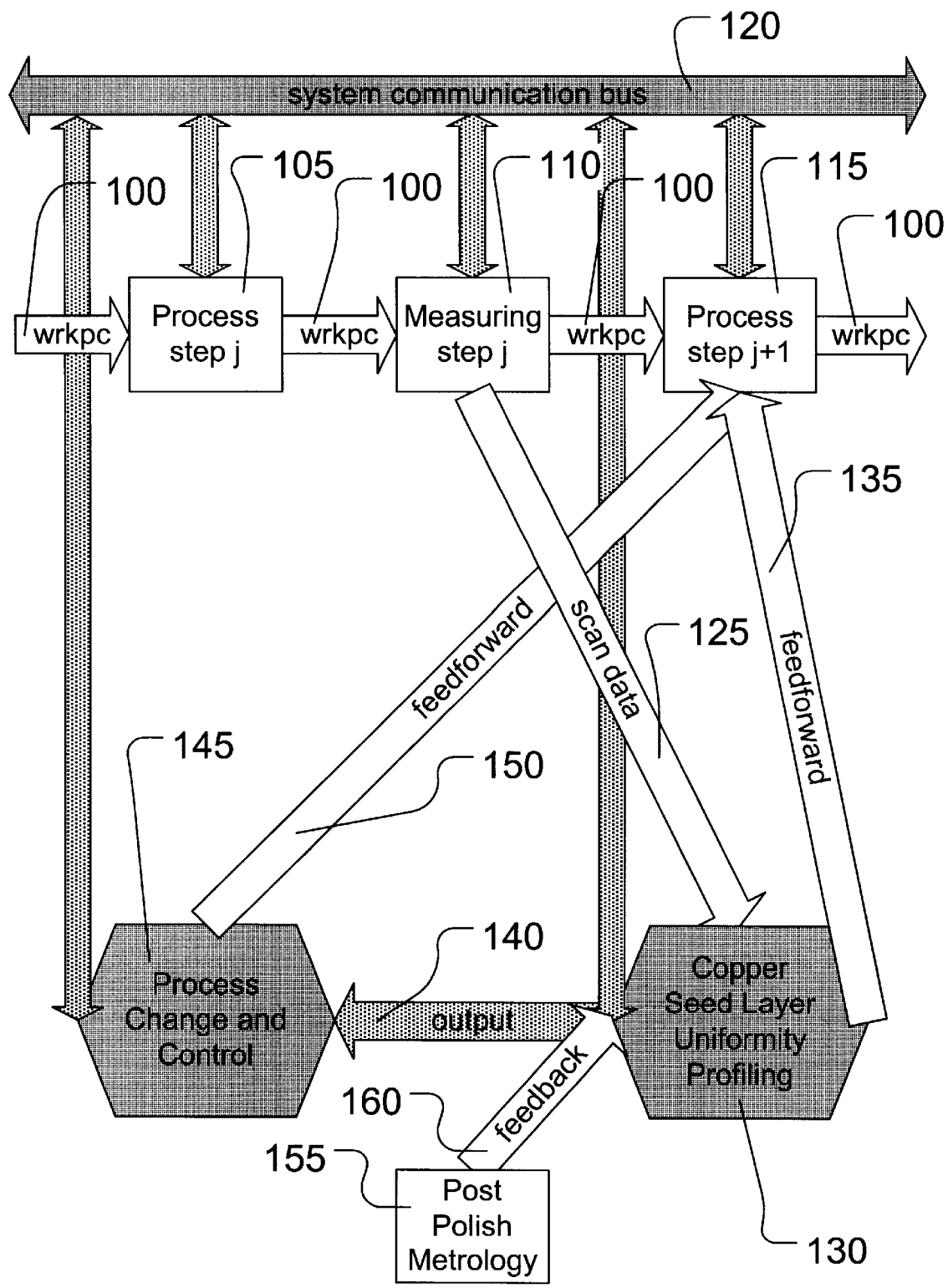
Figure 11:
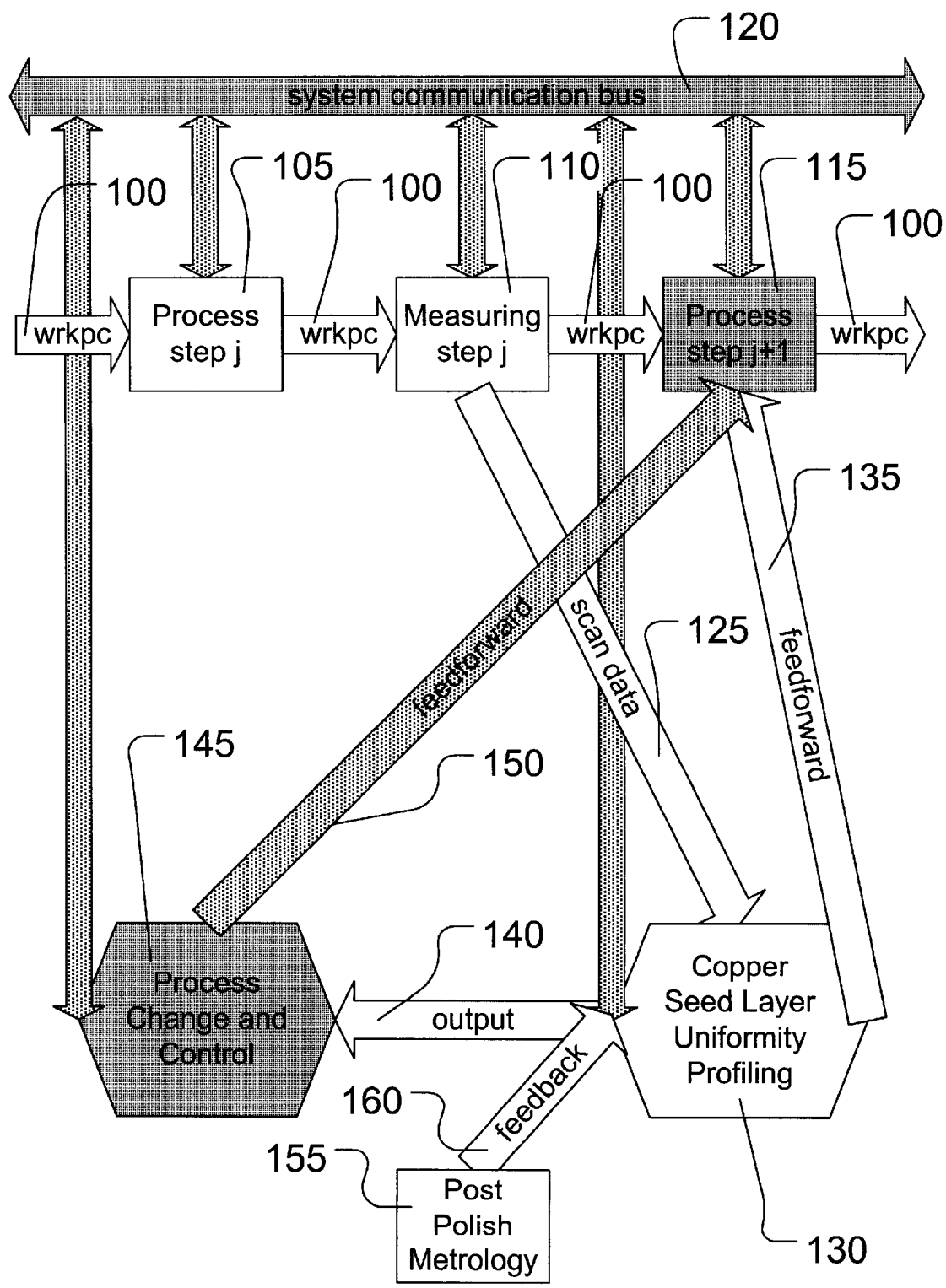

As shown in FIG. 10, in addition to, and/or instead of, the feedforward control signal 135, the output signal 140 may be sent from the copper seed layer uniformity profiling step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j+1 115 to adjust the processing performed in the processing step j+1 115. For example, the anode-cathode spacing, the anode power/current settings, the electroplating deposition time, and the like, may be varied and/or modified to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize the subsequent chemical mechanical planarization or polishing (CMP) techniques.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local composite and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing, according to the present invention, a monitoring and diagnostics system may be provided that monitors this variability and optimizes control of critical parameters.

Figure 12:
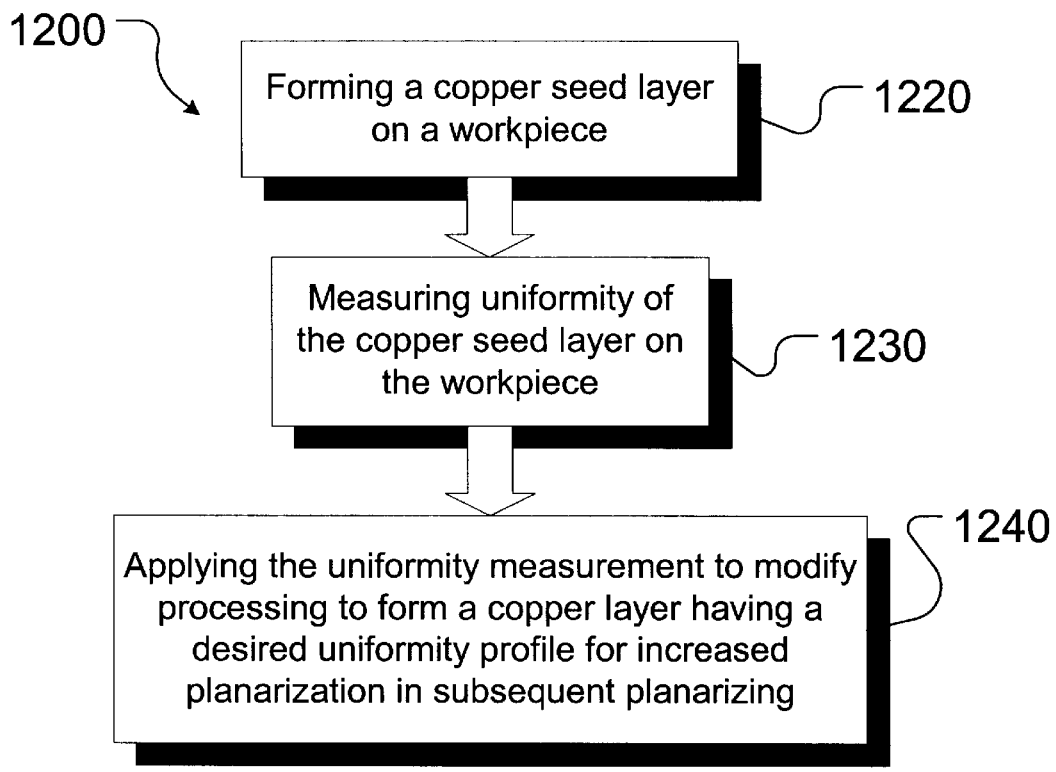
Figure 13:
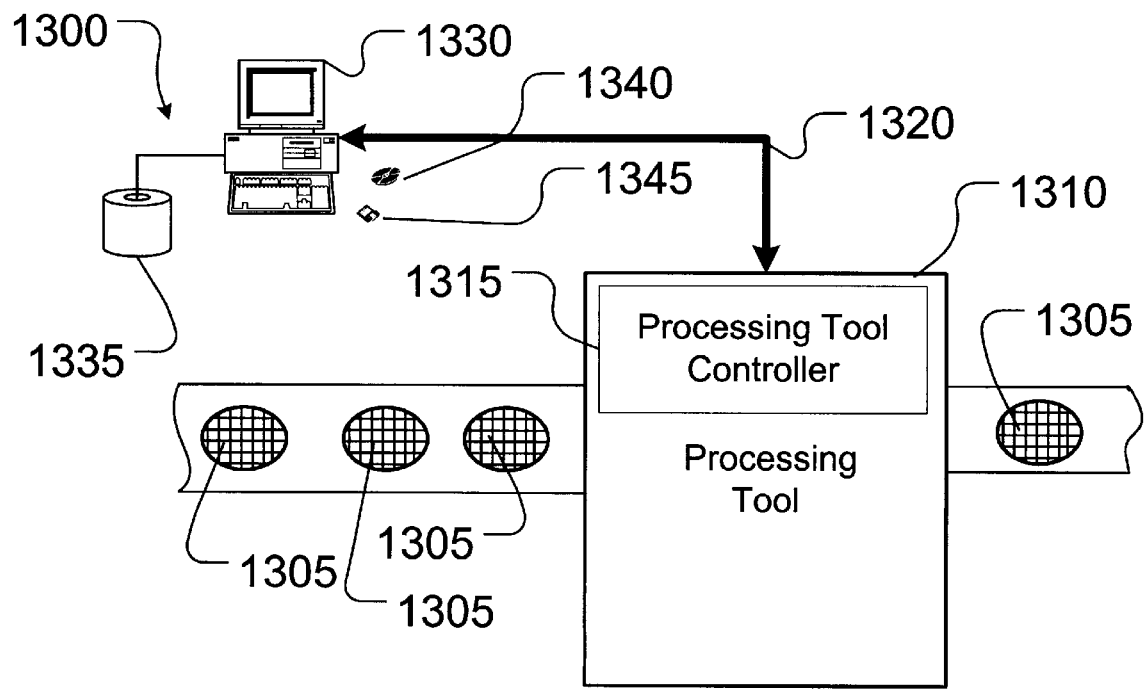

FIG. 12 illustrates one particular embodiment of a method 1200 practiced in accordance with the present invention. FIG. 13 illustrates one particular apparatus 1300 with which the method 1200 may be practiced. For the sake of clarity, and to further an understanding of the invention, the method 1200 shall be disclosed in the context of the apparatus 1300. However, the invention is not so limited and admits wide variation, as is discussed further below.

Referring now to both FIGS. 12 and 13, a batch or lot of workpieces or wafers 1305 is being processed through a processing tool 1310. The processing tool 1310 may be any processing tool known to the art, provided it comprises the requisite control capabilities. The processing tool 1310 comprises a processing tool controller 1315 for this purpose. The nature and function of the processing tool controller 1315 will be implementation specific. For example, in various illustrative embodiments, the processing tool 1310 may be an electroplating tool. Appropriate exemplary electroplating systems may be provided by the Novellus SABRE tools, the Applied Materials Electra tools, or the Semitool LT210C.

An electroplating tool controller 1315 may control electroplating recipe input parameters such as the anode-cathode spacing, the anode power settings, the electroplating deposition time, and the like. These control input parameters will, in turn, control the uniformity characterized by $t_{d2}$, the difference between the thickness of the copper (Cu) layer 425 in the center of the workpiece 100 and the thickness of the copper (Cu) layer 425 at the edge of the workpiece 100 (FIGS. 6 and 7). In various illustrative alternative embodiments, for example, the processing tool 1310 may be a barrier and/or copper (Cu) seed layer processing tool. Four workpieces 1305 are shown in FIG. 13, but the lot of workpieces or wafers, i.e., the "wafer lot," may be any practicable number of wafers from one to any finite number.

The method 1200 begins, as set forth in box 1220, by forming a copper seed layer on a workpiece 1305 in the processing tool 1310, which is the barrier and/or copper (Cu) seed layer 335 processing tool, in various illustrative embodiments. The nature, identity, and measurement of parameters characteristic of the processing performed in the processing tool 1310 will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude.

As shown in FIG. 12, the method 1200 proceeds by measuring uniformity of the copper seed layer 335 on the workpiece 1305, as set forth in box 1230. As described above, the uniformity of the copper seed layer 335 may be measured either on a workpiece-by-workpiece basis or on a lot-by-lot basis, using a multi-point contour map made using metrology products, such as the Rudolph Technologies, Inc. MetaPULSE™ 200 system and tool, or the Phillips Ruby system. FIGS. 3–7 schematically illustrate a copper seed layer 335 uniformity determination and subsequent processing to form an overlying copper layer 425.

The metrology tool typically does not directly feed the copper seed layer 335 uniformity determination information to the processing tool 1310. The copper seed layer 335 uniformity determination information of a workpiece 1305, and/or an average of the copper seed layer 335 uniformity determinations of the workpieces 1305 in a lot, is an illustrative example of a parameter characteristic of the processing performed on the workpiece in the processing tool 1310. The computer system 1330 in FIG. 13 is, in this particular embodiment, programmed to calculate and/or determine the appropriate anode-cathode spacing and/or the anode power/current settings and/or the electroplating deposition time, and the like, to give the variations and/or modifications needed to give the desired total thickness ($t_{d3}$) of the barrier metal layer(s) of tantalum (Ta) and the copper (Cu) seed layer 335 and the copper (Cu) layer 425, and the overall uniformity profile to optimize a subsequent chemical mechanical planarization or polishing (CMP) processing step, such as the further processing step j+1 115. The polish profile, which may vary from machine to machine, may also be fed back.

Turning to FIG. 13, in this particular embodiment, the parameters characteristic of the processing performed in the processing tool 1310 are measured and/or monitored by tool sensors (not shown). The outputs of these tool sensors are transmitted to a computer system 1330 over a line 1320. The computer system 1330 analyzes these sensor outputs to identify the characteristic parameters.

In the embodiment of FIG. 13, a database 1335 stores a plurality of models that might potentially be applied, depending upon which characteristic parameter is identified. This particular embodiment, therefore, requires some a priori knowledge of the characteristic parameters that might be measured. The computer system 1330 then extracts an appropriate model from the database 1335 of potential models to apply to the identified characteristic parameters. If the database 1335 does not comprise an appropriate model, then the characteristic parameter may be ignored, or the computer system 1330 may attempt to develop one, if so programmed. The database 1335 may be stored on any kind of computer-readable, program storage medium, such as an optical disk 1340, a floppy disk 1345, or a hard disk drive (not shown) of the computer system 1330. The database 1335 may also be stored on a separate computer system (not shown) that interfaces with the computer system 1330.

Modeling of the identified characteristic parameter may be implemented differently in alternative embodiments. For instance, the computer system 1330 may be programmed using some form of artificial intelligence to analyze the sensor outputs and controller inputs to develop a model on-the-fly in a real-time implementation. This approach might be a useful adjunct to the embodiment illustrated in FIG. 13, and discussed above, where characteristic parameters are measured and identified for which the database 1335 has no appropriate model.

The method 1200 of FIG. 12 then proceeds by applying the uniformity measurement to modify processing to form a copper layer 425 having a desired uniformity profile for increased planarization in subsequent planarizing, as set forth in box 1240. For example, depending on the implementation, as described above, the anode-cathode spacing, the anode power/current settings, the electroplating deposition time, and the like, may be varied and/or modified to give the desired total thickness ($t_{d3}$) of the barrier metal layer(s) of tantalum (Ta), tantalum nitride (TaN) and the copper (Cu) seed layer 335 and the copper (Cu) layer 425, and the overall uniformity profile to optimize the subsequent chemical mechanical planarization or polishing (CMP) techniques. The modeling may also involve fitting based on the polisher profile, which may be different from tool to tool. The new control input is then formulated from the value yielded by the uniformity profiling calculation and/or model and is transmitted to the electroplating tool controller 1315 over the line 1320. The processing tool controller 1315 then controls subsequent processing operations in accordance with the new control inputs.

Some alternative embodiments may employ a form of feedback to improve the modeling of characteristic parameters. The implementation of this feedback is dependent on several disparate facts, comprising the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention may be implemented in software. For instance, the acts set forth in the boxes 1220–1240 in FIG. 12 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1345 or the computer 1330 hard disk drive (not shown), or optical, such as the optical disk 1340. When these instructions are executed by a computer, they perform the disclosed functions. The computer may be a desktop computer, such as the computer 1330. However, the computer might alternatively be a processor embedded in the processing tool 1310. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Any of the above-disclosed embodiments of a method according to the present invention enables the use of parametric measurements sent from measuring tools to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention.

What is claimed is:

1. A method comprising:

determining a planarization profile of a polishing device;

forming a copper seed layer on a workpiece;

measuring a surface uniformity of the copper seed layer formed on the workpiece; and applying the measured surface uniformity and the determined planarization profile to modify processing to form a copper layer having a desired surface uniformity profile above at least one subsequently processed workpiece.

2. The method of claim 1, wherein measuring the surface uniformity of the copper seed layer on the workpiece comprises determining a workpiece deposition pattern.

3. The method of claim 2, wherein determining the workpiece deposition pattern comprises determining a center thin/thick deposition pattern and a magnitude of thickness difference between the center and the edge of the workpiece.

4. The method of claim 1, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired surface uniformity profile.

5. The method of claim 2, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired uniformity profile.

6. The method of claim 3, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired uniformity profile.

7. The method of claim 1, wherein applying the measured surface uniformity to modify the processing to form the copper layer having the desired surface uniformity profile comprises using an advanced process controller to feed forward the measured surface uniformity to an electroplating processing tool.

8. The method of claim 2, wherein applying the measured surface uniformity to modify the processing to form the copper layer having the desired surface uniformity profile comprises using an advanced process controller to feed forward the measured surface uniformity measurement to an electroplating processing tool.

9. The method of claim 3, wherein applying the measured surface uniformity to modify the processing to form the copper layer having the desired surface uniformity profile comprises using an advanced process controller to feed forward the measured surface uniformity measurement to an electroplating processing tool.

10. The method of claim 4, wherein applying the measured surface uniformity to modify the processing to form the copper layer having the desired surface uniformity profile comprises using an advanced process controller to feed forward the measured surface uniformity measurement to an electroplating processing tool.

11. A method comprising:

determining a planarization profile of a chemical mechanical polishing device;

forming a copper seed layer on a workpiece;

measuring a surface uniformity of the copper seed layer formed on the workpiece; and applying the measured surface uniformity and the determined planarization profile to modify processing to form a copper layer having a desired surface uniformity profile above at least one subsequently processed workpiece.

12. The method of claim 11, wherein measuring the surface uniformity of the copper seed layer on the workpiece comprises determining a workpiece deposition pattern.

13. The method of claim 12, wherein determining the workpiece deposition pattern comprises determining a center thin/thick deposition pattern and a magnitude of thickness difference between the center and the edge of the workpiece.

14. The method of claim 11, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired surface uniformity profile.

15. The method of claim 12, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired surface uniformity profile.

16. The method of claim 13, wherein applying the measured surface uniformity to modify the processing to form the copper layer having the desired surface uniformity profile comprises feeding forward the measured surface uniformity to an electroplating processing tool to modify at least one of an anode-cathode spacing, an anode power setting, an anode current setting, an anode waveform setting, and an electroplating time to form the copper layer having the desired surface uniformity profile.

17. The method of claim 11, wherein applying the measured surface uniformity to modify the processing to form the copper layer having the desired surface uniformity profile comprises using an advanced process controller to feed forward the measured surface uniformity to an electroplating processing tool.

18. The method of claim 12, wherein applying the measured surface uniformity to modify the processing to form the copper layer having the desired surface uniformity profile comprises using an advanced process controller to feed forward the measured surface uniformity to an electroplating processing tool.

19. The method of claim 13, wherein applying the measured surface uniformity to modify the processing to form the copper layer having the desired surface uniformity profile comprises using an advanced process controller to feed forward the measured surface uniformity to an electroplating processing tool.

20. The method of claim 14, wherein applying the measured surface uniformity to modify the processing to form the copper layer having the desired surface uniformity profile comprises using an advanced process controller to feed forward the measured surface uniformity to an electroplating processing tool.

* * * * *